US007097541B2

(12) United States Patent
DeRege Thesauro et al.

(10) Patent No.: US 7,097,541 B2
(45) Date of Patent: *Aug. 29, 2006

(54) CMP METHOD FOR NOBLE METALS

(75) Inventors: Francesco DeRege Thesauro, Naperville, IL (US); Vlasta Brusic, Geneva, IL (US); Benjamin P. Bayer, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 51 days.

This patent is subject to a terminal disclaimer.

(21) Appl. No.: 10/376,172

(22) Filed: Feb. 27, 2003

(65) Prior Publication Data

US 2003/0181142 A1 Sep. 25, 2003

Related U.S. Application Data

(63) Continuation-in-part of application No. 10/054,059, filed on Jan. 22, 2002, now Pat. No. 6,527,622.

(51) Int. Cl.
*B24B 1/00* (2006.01)

(52) U.S. Cl. .................. 451/36; 51/307; 252/79.1; 257/E21.304; 438/693

(58) Field of Classification Search .............. 451/28, 451/36, 41, 60; 51/307–309; 252/79.1; 257/E21.304; 438/692, 693
See application file for complete search history.

(56) References Cited

U.S. PATENT DOCUMENTS

| 5,044,128 | A |  | 9/1991 | Nakano |  |
| 5,489,233 | A |  | 2/1996 | Cook et al. |  |
| 5,527,423 | A |  | 6/1996 | Neville et al. |  |
| 5,626,715 | A |  | 5/1997 | Rostoker |  |
| 5,691,219 | A |  | 11/1997 | Kawakubo et al. |  |
| 5,693,239 | A |  | 12/1997 | Wang et al. |  |
| 5,709,588 | A | * | 1/1998 | Muroyama | 451/41 |
| 5,868,604 | A |  | 2/1999 | Atsugi et al. |  |
| 5,958,794 | A |  | 9/1999 | Bruxvoort et al. |  |
| 6,063,306 | A |  | 5/2000 | Kaufman et al. |  |
| 6,093,649 | A |  | 7/2000 | Roberts et al. |  |
| 6,126,853 | A |  | 10/2000 | Kaufman et al. |  |
| 6,146,244 | A |  | 11/2000 | Atsugi et al. |  |
| 6,274,063 | B1 |  | 8/2001 | Li et al. |  |
| 6,290,736 | B1 |  | 9/2001 | Evans |  |
| 6,293,848 | B1 |  | 9/2001 | Fang et al. |  |
| 6,312,321 | B1 | * | 11/2001 | Fukushima et al. | 451/60 |
| 6,569,215 | B1 | * | 5/2003 | Miyata | 51/307 |
| 6,623,355 | B1 | * | 9/2003 | McClain et al. | 451/60 |
| 2001/0049913 | A1 |  | 12/2001 | Miyata |  |
| 2002/0039839 | A1 |  | 4/2002 | Thomas et al. |  |
| 2003/0006396 | A1 |  | 1/2003 | Wang et al. |  |

FOREIGN PATENT DOCUMENTS

| JP | 63-96599 A | 4/1988 |
| JP | 1-270512 A | 10/1989 |
| JP | 11-121411 A | 4/1999 |
| WO | WO 00/77107 A1 | 12/2000 |
| WO | WO 01/44396 A1 | 6/2001 |
| WO | WO 2004/044075 | 5/2004 |
| WO | WO 2004/069947 | 8/2004 |

* cited by examiner

*Primary Examiner*—Hadi Shakeri
(74) *Attorney, Agent, or Firm*—Caryn Borg-Breen

(57) ABSTRACT

The invention provides a method of polishing a substrate comprising a noble metal comprising (i) contacting the substrate with a CMP system and (ii) abrading at least a portion of the substrate to polish the substrate. The CMP system comprises an abrasive and/or polishing pad, a liquid carrier, and a sulfonic acid compound.

15 Claims, No Drawings

CMP METHOD FOR NOBLE METALS

CROSS-REFERENCE TO RELATED PATENT APPLICATIONS

This patent application is a continuation-in-part of U.S. patent application Ser. No. 10/054,059, filed Jan. 22, 2002, issued as U.S. Pat. No. 6.527,622.

FIELD OF THE INVENTION

This invention pertains to a method of polishing a substrate comprising a noble metal.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates, and their use in the chemical-mechanical polishing of semiconductor surfaces can result in poor surface quality. Because the performance of a semiconductor wafer is directly associated with the planarity of its surface, it is crucial to use a polishing composition and method that results in a high polishing efficiency, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Various metals and metal alloys have been used to form electrical connections between interconnection levels and devices, including titanium, titanium nitride, aluminum-copper, aluminum-silicon, copper, tungsten, platinum, platinum-tungsten, platinum-tin, ruthenium, and combinations thereof. Noble metals present a particular challenge in that they are mechanically hard and chemically resistant, making them difficult to remove efficiently through chemical-mechanical polishing.

The following patents disclose polishing compositions for noble metals. U.S. Pat. No. 5,691,219 discloses a semiconductor memory device comprising a noble metal conductive layer and a polishing composition comprising a halo-compound for polishing the noble metal. U.S. Pat. No. 6,274,063 discloses polishing compositions for nickel substrates comprising a chemical etchant (e.g., aluminum nitrate), abrasive particles, and an oxidizer. U.S. Pat. No. 6,290,736 discloses a chemically active polishing composition for noble metals comprising an abrasive and a halogen in basic aqueous solution. JP 63096599 A2 discloses a method of dissolving metallic ruthenium. JP 11121411 A2 discloses a polishing composition for platinum group metals (e.g., Ru, Pt) comprising fine particles of an oxide of the platinum group metal. JP 1270512 A2 discloses a dissolving solution for noble metals comprising hydrogen peroxide, alkali cyanide, and phosphate ion and/or borate ion. WO 00/77107 A1 discloses a polishing composition for noble metals (e.g., Ru, Rh, Pd, Os, Ir, Pt) comprising abrasive, a liquid carrier, an oxidizer, and a polishing additive including EDTA, nitrogen-containing macrocycles (e.g., tetraazacyclotetradecanes), crown ethers, halides, cyanides, citric acid, phosphines, and phosphonates. WO 01/44396 A1 discloses a polishing composition for noble metals comprising sulfur-containing compounds, abrasive particles, and water-soluble organic additives which purportedly improve the dispersion of the abrasive particles and enhance metal removal rates and selectivity.

A need remains, however, for polishing systems and polishing methods that will exhibit desirable planarization efficiency, uniformity, and removal rate during the polishing and planarization of substrates, while minimizing defectivity, such as surface imperfections and damage to underlying structures and topography during polishing and planarization. Improved polishing systems are particularly needed for the polishing of chemically stable and mechanically hard noble metal-containing substrates.

The present invention seeks to provide such a chemical-mechanical polishing system and method. These and other advantages of the invention will be apparent from the description of the invention provided herein.

BRIEF SUMMARY OF THE INVENTION

The invention provides a method of polishing a substrate comprising (i) contacting a substrate comprising a noble metal with a chemical-mechanical polishing system comprising (a) an abrasive and/or polishing pad, (b) a liquid carrier, and (c) a sulfonic acid compound or salt thereof, wherein the chemical-mechanical polishing system has a pH of about 2 to about 12, and (ii) abrading at least a portion of the substrate to polish the substrate.

DETAILED DESCRIPTION OF THE INVENTION

The invention is directed to methods of polishing a substrate comprising a noble metal. The substrate is contacted with a chemical-mechanical polishing ("CMP") system comprising (a) an abrasive and/or polishing pad, (b) a liquid carrier, and optionally (c) at least one polishing additive (i.e., one or more polishing additives). The polishing additive can be any suitable compound that desirably increases the rate at which the system polishes at least one noble metal layer of the substrate. At least a portion of the substrate is abraded so as to polish the surface of the substrate. The abrasive (when present and suspended in the liquid carrier), the liquid carrier, and optional polishing additive(s), as well as any other components suspended in the liquid carrier, form the polishing composition of the CMP system.

The CMP systems described herein comprise an abrasive, a polishing pad, or both. Preferably, the CMP systems comprise both an abrasive and a polishing pad. The abrasive can be fixed on the polishing pad and/or can be in particulate form and suspended in the liquid carrier. The polishing pad can be any suitable polishing pad.

The abrasive can be any suitable abrasive, many of which are known in the art. For example, the abrasive can be natural or synthetic and can comprise diamond (e.g., polycrystalline diamond), garnet, glass, carborundum, metal oxide, nitride, carbide, polymer, composite (e.g., polymer composite or polymer/metal oxide composite), and the like. The choice of abrasive can depend on the particular nature of the substrate being polished. The abrasive preferably comprises metal oxide, diamond, silicon carbide, silicon nitride, boron nitride, or combinations thereof. The metal oxide desirably is selected from the group consisting of alumina, silica, titania, ceria, zirconia, germania, magnesia, co-formed products thereof, and combinations thereof. More preferably, the abrasive comprises silica, alumina (e.g., α-alumina, fumed alumina), silicon nitride, and/or silicon carbide. In some embodiments, the abrasive preferably comprises α-alumina having a mean particle size of about 150 nm or greater (e.g., about 200 nm or greater, or about 250 nm or greater). Typically, the α-alumina is used in combination with a softer abrasive (e.g., fumed alumina). The abrasive can have any suitable particle size. In some embodiments, the use of α-alumina having a mean particle size of about 150 nm or greater (e.g., about 200 nm or greater, or about 250 nm or greater) is preferred. The mean particle size is reported as determined by light scattering, for example, using a Hariba LA-910 instrument.

When the abrasive is present in the CMP systems and is suspended in the liquid carrier (i.e., when the abrasive is a component of the polishing composition), any suitable amount of abrasive can be present in the polishing composition. Typically, about 0.01 wt. % or more (e.g., about 0.03 wt. % or more, or about 0.05 wt. % or more) abrasive will be present in the polishing composition. More typically, about 0.1 wt. % or more abrasive will be present in the polishing composition. The amount of abrasive in the polishing composition typically will not exceed about 50 wt. %, more typically will not exceed about 20 wt. %. Preferably, the amount of abrasive in the polishing composition is about 0.5 wt. % to about 10 wt. %. In some embodiments, the amount of abrasive in the polishing composition desirably is about 0.1 wt. % to about 5 wt. %.

A liquid carrier is used to facilitate the application of the abrasive (when present), one or more polishing additives, and any optional additives to the surface of a suitable substrate to be polished or planarized. The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

In a first embodiment of the invention, a polishing additive is present in the chemical mechanical polishing system. The polishing additive interacts with the noble metal surface and promotes its dissolution during chemical-mechanical polishing. Suitable polishing additives include diketones, diketonates, urea compounds, heterocyclic nitrogen-containing compounds, heterocyclic oxygen-containing compounds, heterocyclic phosphorus-containing compounds, nitrogen-containing compounds that can be zwitterionic compounds, sulfonic acid compounds, salts thereof, and combinations thereof.

Suitable diketones and diketonates include, for example, cyclopentanediones, cyclohexanediones, cyclobutanediones, cycloheptanediones, linear diketones, and alkylammonium-2,4-pentanedionate salts. Suitable heterocyclic nitrogen-containing compounds include, for example, pyridines, bipyridines, quinolines, phenanthrolines, pyrimidines, hydropyrimidines, pyrazines, pyrazoles, imidazoles, imidazolines, imidazolidines, piperazines, triazines, purines, oxazoles, oxazines, pyrroles, pyrrolines, pyrrolidines, indoles, indolines, isoindoles, carbazoles, and combinations thereof. Suitable heterocyclic oxygen-containing compounds include, for example, dioxolanes, trioxolanes, furans, pyrones, morpholines, coumarins, benzopyrones, dioxanes, trioxanes, and ozonides. Suitable heterocyclic phosphorus-containing compounds include, for example, phospholes, phospholanes, phospholenes, and phospholidines. The heterocyclic nitrogen-, oxygen-, and phosphorus-containing compounds may further comprise one or more alcohol, amide, ketone, carboxylic acid, or sulfonic acid groups. For example, the heterocyclic nitrogen-containing polishing additives can be picolinic acid, 2-pyridinecarboxaldehyde, 3-pyridinecarboxaldehyde, 4-pyridinecarboxaldehyde, 2-pyridinemethanol, 2,3-pyridinedicarboxylic acid, 2,6-pyridinedicarboxylic acid, 2-pyridylacetic acid HCl, 3-pyridylacetic acid HCl, 2-pyridineethanesulfonic acid, 4-pyridineethanesulfonic acid, 1-(3-sulfopropyl)pyridinium hydroxide, adenine, guanine, cytosine, and thymine.

The nitrogen-containing compounds that can be zwitterionic compounds are nitrogen-containing compounds that can be zwitterionic compounds at a particular pH. Zwitterionic compounds are neutral compounds having formal opposite charges on non-adjacent atoms. Zwitterionic compounds typically contain both an acid moiety and a base moiety, with the pKa of the acid moiety differing from the pKa of the base moiety, such that the compound is zwitterionic when the pH is between the pKa of the acid moiety and the pKa of the base moiety. Zwitterionic compounds also are referred to as inner salts. For example, amino acids are nitrogen-containing compounds that can be zwitterionic compounds, though the nitrogen-containing compounds that can be zwitterionic compounds need not be amino acids. In that respect, as regards the polishing additives identified above, pyridineethanesulfonic acids, pyridine sulfonic acids, pyridyl acetic acids, 3-(3-pyridyl)proprionic acid, pyrazine carboxylic acid, 1-(3-sulfopropyl)pyridinium hydroxide, and picolinic acid are nitrogen-containing compounds that can be zwitterionic compounds. Additional nitrogen-containing compounds that can be zwitterionic compounds, which are useful in the polishing composition of the invention, include sulfanilic acid, dodecyldimethyl(3-sulfopropyl)ammonium hydroxide (lauryl sulfobetaine), (carboxymethyl)trimethylammonium hydroxide (betaine), 2-(N-morpholino)ethanesulfonic acid, N-2-acetamidoiminodiacetic acid, 1,3-bis[tris(hydroxymethyl)methylamino]propane, N-2-acetamido-2-aminoethanesulfonic acid, 3-(N-morpholine)propanesulfonic acid, N-tris(hydroxymethyl)methyl-2-aminoethanesulfonic acid, N-2-hydroxyethylpiperazine-N'-2-ethanesulfonic acid, N-2-hydroxyethylpiperazine-N'-3-propanesulfonic acid, N-tris(hydroxymethyl)methylglycine, cyclohexylaminoethanesulfonic acid, 3-(cyclohexylamino)

propanesulfonic acid, 2-acrylamido-2-methylpropanesulfonic acid, salts thereof, and combinations thereof.

The sulfonic acid compound is a mono-, di-, tri-, or poly-sulfonic acid compound or a salt thereof. Preferably, the sulfonic acid compound is a mono-, di-, or tri-sulfonic acid compound or a salt thereof. Typically, the sulfonic acid compound is selected from the group consisting of an aryl sulfonic acid, an alkylsulfonic acid, a heterocyclic sulfonic acid, or a salt thereof. Suitable sulfonic acid compounds include any of the sulfonic acid compounds described above, for example, pyridineethanesulfonic acids, pyridine sulfonic acids, 1-(3-sulfopropyl)pyridinium hydroxide, sulfanilic acid, dodecyldimethyl(3-sulfopropyl)ammonium hydroxide, 2-(N-morpholino)ethanesulfonic acid, N-2-acetamido-2-aminoethanesulfonic acid, 3-(N-morpholine)propanesulfonic acid, N-tris(hydroxymethyl)methyl-2-aminoethanesulfonic acid, N-2-hydroxyethylpiperazine-N'-2-ethanesulfonic acid, N-2-hydroxyethylpiperazine-N'-3-propanesulfonic acid, cyclohexylaminoethanesulfonic acid, 3-(cyclohexylamino)propanesulfonic acid, and 2-acrylamido-2-methylpropanesulfonic acid. In addition, the sulfonic acid compound can be selected from the group consisting of benzenesulfonic acid, hydroquinonesulfonic acid, isethionic acid, 4,7-diphenyl-1,10-phenanthrolinedisulfonic acid, 1,2-naphthoquinone-4-sulfonic acid, aminoanthraquinone sulfonic acid, 2-formylbenzenesulfonic acid, 3-amino-4-hydroxybenzenesulfonic acid, 4-hydroxybenzenesulfonic acid, 6-aminotoluene-3-sulfonic acid, benzidine-3-sulfonic acid, diphenylamine-4-sulfonic acid, hydroxylamine-O-sulfonic acid, piperidine sulfonic acid, p-anisidine-3-sulfonic acid, p-xylene-2-sulfonic acid, methanesulfonic acid, 3-cyclohexylamino-1-propanesulfonic acid, 5-formyl-2-furanesulfonic acid, salts thereof, and combinations thereof.

Preferably, the polishing additive is selected from the group consisting of picolinic acid, 2-pyridinecarboxaldehyde, 2-pyridinemethanol, 2,3-pyridinedicarboxylic acid, 2,6-pyridinedicarboxylic acid, 2-pyridylacetic acid HCl, 2-pyridineethanesulfonic acid, 4-pyridineethanesulfonic acid, 1,10-phenanthroline, 1,2-pentadione, sulfanilic acid, pyridinesulfonic acid, 1-(3-sulfopropyl)pyridinium hydroxide, hydroquinonesulfonic acid, N-tris(hydroxymethyl)methyl-2-aminoethanesulfonic acid, benzenesulfonic acid, isethionic acid, salts thereof, and combinations thereof.

When the polishing additive is a sulfonic acid compound, desirably the abrasive comprises alumina, particularly α-alumina. Preferably, the abrasive comprises a mixture of α-alumina and fumed alumina (e.g., about 60% α-alumina and about 40% fumed alumina). More preferably, the abrasive comprises α-alumina having a mean particle size of about 150 nm or greater (e.g., about 200 nm or greater, or about 250 nm or greater).

The CMP system can comprise any suitable amount of polishing additive(s) of the first embodiment and typically comprises about 0.01 wt. % or more of such polishing additive(s). Preferably, the CMP system comprises about 0.01 wt. % to about 10 wt. % (e.g., about 0.1 wt. % to about 10 wt. %) of such polishing additive(s). More preferably, the CMP system comprises 0.1 wt. % to about 5 wt. % (e.g., about 0.1 wt. % to about 2 wt. %) of such polishing additive(s).

In a second embodiment of the invention, a polishing additive and a peroxy-type oxidizer are present in the chemical mechanical polishing system. The polishing additive is a metal compound having two or more oxidation states. The polishing additive can be a metal salt or a metal ligand complex. For example, the polishing additive can be an iron, copper, or manganese compound of formula MX, $MX_2$, $MX_3$, or $M_2X_3$ where M is Fe, Cu, or Mn, and X is selected from the group consisting of nitrate, fluoride, chloride, bromide, iodide, oxide, hydroxide, sulfate, acetate, oxalate, acetylacetonate, citrate, tartrate, malonate, gluconate, phthalate, succinate, perchlorate, perbromate, periodate, and combinations thereof. The polishing additive also can be a cerium compound of formula $CeX_2$ where X is selected from oxide, hydroxide, and combinations thereof. Preferably, the polishing additive is iron sulfate, iron nitrate, copper nitrate, or manganese perchlorate. The CMP system may contain one or more polishing additives and may contain mixtures of the polishing additives described above.

The CMP system can comprise any suitable amount of polishing additive(s) of the second embodiment and typically comprises about 0.0001 wt. % or more of such polishing additive(s). Preferably, the CMP system comprises about 0.001 wt. % to about 5 wt. % of such polishing additive(s). More preferably, the CMP system comprises 0.001 wt. % to about 2 wt. % of such polishing additive(s).

In a third embodiment, an abrasive is present in the chemical-mechanical polishing system and is suspended in the liquid carrier. The abrasive mixture comprises α-alumina and fumed alumina. Typically, the weight ratio of α-alumina to fumed alumina is about 0.6:1 to about 9:1. Preferably, the weight ratio of α-alumina to fumed alumina is about 1:1 to about 4:1 (e.g., about 1.5:1 to about 3:1).

The CMP system of the third embodiment optionally further comprises a polishing additive. The polishing additive can be any suitable polishing additive. For example, the polishing additive can be any of the polishing additives discussed above with respect to the first and second embodiments. Suitable polishing additives further include carboxylates and acids thereof, hydroxylates and acids thereof, carbonylates and acids thereof, pyrophosphates, condensed phosphates, phosphonic acids and salts thereof, amines, amino alcohols, amides, imines, imino acids and salts thereof, nitrites, nitros, thiols, thioesters, thioethers, carbothiolic acids and salts thereof, carbothionic acids and salts thereof, thiocarboxylic acids and salts thereof, sulfonic acids and salts thereof, thiosalicylic acids and salts thereof, and mixtures thereof.

The CMP systems optionally further comprise a per-type oxidizer. The CMP system of the second embodiment comprises a peroxy-type oxidizer. The per-type oxidizer can be any suitable per-type oxidizer. Suitable per-type oxidizers include inorganic and organic per-compounds. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The per-type oxidizer preferably is selected from the group consisting of hydrogen peroxide, persulfate salts (e.g., ammonium persulfate), periodate salts, and permanganate salts. More preferably, the per-type oxidizer is ammonium persulfate or hydrogen peroxide.

The peroxy-type oxidizer is a compound containing at least one peroxy group and is selected from the group consisting of organic peroxides, inorganic peroxides, and mixtures thereof. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Preferably, the peroxy-type oxidizer is hydrogen peroxide.

The CMP systems can contain any suitable amount of per-type or peroxy-type oxidizer. The CMP system preferably comprises about 0.5 to about 20 wt. % per-type oxidizer with the polishing additive(s) of the first embodiment. The CMP system preferably comprises about 0.1 wt. % to about 20 wt. % (e.g., about 1 wt. % to about 10 wt. %) peroxy-type oxidizer with the polishing additive(s) of the second embodiment. The CMP system preferably comprises about 0.5 to about 20 wt. % per-type oxidizer with the abrasive of the third embodiment.

The CMP systems of any of the above embodiments desirably have a pH of about 2 to about 12. The actual pH range will depend at least upon the type of substrate being polished. When the CMP system is used to polish a platinum-containing substrate, the pH is desirably about 2 to about 7. When the CMP system is to polish a ruthenium-containing substrate, the pH is desirably about 5 or more, preferably about 7 to about 11. When the CMP system is used to polish an iridium-containing substrate, the pH is desirably about 5 to about 12, preferably about 7 to about 9. While the use of a higher pH tends to increase the removal rate of the noble metal, the removal rate of silicon dioxide layers similarly increases resulting in an overall decrease in the polishing selectivity.

The CMP systems of any of the above embodiments optionally further comprise an amine-containing monomeric, oligomeric, or polymeric compound, which helps to reduce the removal rate of a silicon dioxide layer. Suitable amine-containing compounds include polyethylenimine, dimethylaminopropylamine, 1,4-bis(3-aminopropyl)piperazine, and the like.

The CMP systems of any of the above embodiments desirably are used in a method of polishing a substrate comprising at least one noble metal layer and optionally an insulating layer, whereby the substrate is contacted with the chemical-mechanical polishing system and at least a portion of the metal layer or insulating layer (if present) of the substrate is abraded such that the metal layer or insulating layer becomes polished. The substrate can be any suitable substrate (e.g., integrated circuit, memory or rigid disk, metal, ILD layer, semiconductor, micro-electro-mechanical system, ferroelectric, magnetic head, polymeric film, and low or high dielectric constant film) and can contain any suitable noble metal or noble metal alloy layer (e.g., metal conductive layer). The insulating layer can comprise any suitable insulating material, such as a metal oxide, porous metal oxide, glass, organic polymer, fluorinated organic polymer, or any other suitable high or low-κ insulating material. The insulating layer preferably comprises a silicon-based metal oxide. The noble metal, noble metal alloy, or noble metal oxide layer preferably comprises platinum (Pt), iridium (Ir), rhenium (Re), ruthenium (Ru), rhodium (Rh), palladium (Pd), silver (Ag), osmium (Os), or gold (Au). Preferably, the noble metal or noble metal alloy layer comprises platinum, ruthenium (e.g., $RuO_2$), or iridium (e.g., $IrO_2$).

The following examples further illustrate the invention but, of course, should not be construed as in any way limiting its scope.

EXAMPLE 1

This example demonstrates the effect of polishing additives on the rate of dissolution of platinum.

The dissolution and corrosion rates of platinum were evaluated electrochemically using a platinum rotating disk electrode (RDE) in the presence of different polishing compositions (Polishing Compositions 1A–1L and 1A'–1L'). The platinum electrode was rotating at 500 rpm and held in contact with an abrasive pad with a down force of about 90 kPa (13 psi). The metal dissolution rate was evaluated as the surface of the electrode was abraded (dissolution rate) and after abrasion (corrosion rate). The platinum activity was measured as a current density and then recalculated into a dissolution rate or corrosion rate (in Å/min) using Faraday's law. When hydrogen peroxide is used as the oxidizer, the calculated rates of dissolution and corrosion include an additional current density resulting from the electrochemical activity of hydrogen peroxide at the electrode. Thus, the reported dissolution and corrosion rates for platinum in the presence of hydrogen peroxide may be greater than the true platinum dissolution and corrosion rates.

Each of the polishing compositions contained 6 wt. % α-alumina and either 1 wt. % ammonium persulfate (Polishing Compositions 1A–1L) or 1 wt. % hydrogen peroxide and 0.1 N $K_2SO_4$ supporting electrolyte (Polishing Compositions 1A'–1L'). Polishing Compositions 1A and 1A' (control) contained no polishing additive. Polishing Compositions 1B–1J and 1B'–1J' (comparative) each contained 1 wt. % of glycine, methionine, histidine, proline, mercaptosuccinic acid, 2-imino-4-thioburet, 2-amino-2-methylpropanol, and KBr, respectively. Polishing Compositions 1K–1L and 1K'–1L' (invention) each contained 1 wt. % of picolinic acid, 2,5-cyclopentanedione, and pyrazole, respectively. The dissolution and corrosion rates for platinum were measured for each of the chemical-mechanical polishing systems. The rates of dissolution and corrosion for platinum in the presence of ammonium persulfate and hydrogen peroxide are summarized in Tables 1 and 2, respectively.

TABLE 1

Platinum Dissolution and Corrosion Rates with Ammonium Persulfate

| Polishing Composition | Polishing Additive | Oxidizer | pH | Pt Diss. Rate | Pt Corr. Rate |
|---|---|---|---|---|---|
| 1A (control) | none | $(NH_4)_2S_2O_8$ | 4.6 | 16.8 | <0.1 |
| | | | 7.2 | 34.6 | 1.2 |
| | | | 9.0 | 42 | 0.2 |
| 1B (comparative) | glycine | $(NH_4)_2S_2O_8$ | 5.1 | 17.4 | — |
| | | | 7.1 | 37.7 | |
| | | | 8.5 | 34.8 | |
| 1C (comparative) | methionine | $(NH_4)_2S_2O_8$ | 2.1 | 14.5 | 0.1 |
| | | | 6.1 | 14.5 | 0.1 |
| | | | 8.0 | 1.74 | 0.1 |
| 1D (comparative) | histidine | $(NH_4)_2S_2O_8$ | 4.1 | 29 | 0.1 |
| | | | 7.0 | 29 | 0.1 |
| | | | 9 | 34.9 | 0.1 |
| 1E (comparative) | proline | $(NH_4)_2S_2O_8$ | 4.9 | 34.8 | 0.1 |
| | | | 7.4 | 34.8 | 0.3 |
| | | | 8.9 | 58 | 0.1 |
| 1F (comparative) | mercaptosuccinic acid | $(NH_4)_2S_2O_8$ | 2.2 | 29 | — |
| | | | 6.2 | 29 | |
| | | | 8.3 | 29 | |
| 1G (comparative) | 2-imino-4-thioburet | $(NH_4)_2S_2O_8$ | 3.9 | 31.9 | 0.1 |
| | | | 6.1 | 29 | 0.1 |
| | | | 8.5 | 23.2 | 0.1 |
| 1H (comparative) | 2-amino-2-methylpropanol | $(NH_4)_2S_2O_8$ | 3.9 | 31.9 | 0.6 |
| | | | 6.8 | 34.8 | 2.9 |
| | | | 9.6 | 46.4 | 2.9 |
| 1I (comparative) | KBr | $(NH_4)_2S_2O_8$ | 4 | 34.8 | 0.1 |
| | | | 7 | 37.7 | 0.3 |
| | | | 9 | 58 | 0.9 |
| 1J (invention) | picolinic acid | $(NH_4)_2S_2O_8$ | 4.0 | 20.2 | 0.2 |
| | | | 6.9 | 52.2 | 0.9 |
| | | | 9.8 | 55.1 | 0.2 |
| 1K (invention) | 2,5-cyclopentanedione | $(NH_4)_2S_2O_8$ | 3.9 | 22.6 | 1.5 |
| | | | 6.2 | 20.3 | 2 |
| | | | 8.2 | 24.8 | 1.5 |
| 1L (invention) | pyrazole | $(NH_4)_2S_2O_8$ | 5.1 | 21 | 0.1 |
| | | | 7.0 | 26.1 | 0.5 |
| | | | 8.9 | 29 | 0.9 |

TABLE 2

Platinum Dissolution and Corrosion Rates with Hydrogen Peroxide

| Polishing Composition | Polishing Additive | Oxidizer | pH | Pt Diss. Rate | Pt Corr. Rate |
|---|---|---|---|---|---|
| 1A' (control) | none | $H_2O_2$ | 3.6 | 34.8 | 34.8 |
| | | | 6.0 | 5.8 | 0.93 |
| | | | 8.9 | 20.3 | 9.3 |
| 1B' (comparative) | glycine | $H_2O_2$ | 4 | 63.8 | — |
| | | | 6 | 20.3 | |
| | | | 8.5 | 130.5 | |
| 1C' (comparative) | methionine | $H_2O_2$ | 3.8 | 69.6 | — |
| | | | 5.9 | 66.7 | |
| | | | 8.2 | 101.5 | |
| 1D' (comparative) | histidine | $H_2O_2$ | 3.6 | 174 | — |
| | | | 7.9 | 116 | |
| | | | 9.1 | 261 | |
| 1E' (comparative) | proline | $H_2O_2$ | 4.1 | 43.5 | — |
| | | | 6.1 | 14.5 | |
| | | | 9.1 | 29 | |
| 1F' (comparative) | mercaptosuccinic acid | $H_2O_2$ | 2.2 | 174 | — |
| | | | 6.2 | 377 | |
| | | | 8.3 | 290 | |
| 1G' (comparative) | 2-imino-4-thioburet | $H_2O_2$ | 3.8 | 26.1 | 5.2 |
| | | | 6.1 | 29 | 5.8 |
| | | | 8.2 | 34.8 | 10.2 |
| 1H' (comparative) | 2-amino-2-methylpropanol | $H_2O_2$ | 4.0 | 29 | 34.8 |
| | | | 7.5 | 31 | 31.9 |
| | | | 11.2 | 232 | 290 |
| 1I' (comparative) | KBr | $H_2O_2$ | 4.0 | 26.1 | 0.2 |
| | | | 6.1 | 6.1 | 0.3 |
| | | | 9.5 | 37.7 | 0.2 |
| 1J' (invention) | picolinic acid | $H_2O_2$ | 3.8 | 319 | 290 |
| | | | 7.2 | 63.8 | 58 |
| | | | 9.8 | 34.8 | — |
| 1K' (invention) | 2,5-cyclopentanedione | $H_2O_2$ | 5.4 | 20.3 | 1.7 |
| | | | 6.8 | 18.3 | 2.9 |
| | | | 8.7 | 29 | 17.4 |
| 1L' (invention) | pyrazole | $H_2O_2$ | 4.1 | 34.8 | — |
| | | | 6.2 | 26.1 | |
| | | | 8.9 | 26.1 | |

These results demonstrate that high noble metal dissolution rates can be obtained using a chemical-mechanical polishing composition of the invention.

EXAMPLE 2

This example demonstrates the effect of polishing additives on the rate of dissolution of ruthenium.

The dissolution and corrosion rates of ruthenium were evaluated electrochemically using a ruthenium rotating disk electrode (0.32 cm²) in the presence of different polishing compositions (Polishing Compositions 2A–2G and 2A'–2G'). The ruthenium electrode was rotating at 500 rpm and held in contact with an abrasive pad with a down force of about 90 kPa (13 psi). The metal dissolution rate was evaluated as the surface of the electrode was abraded (dissolution rate) and after abrasion (corrosion rate). The ruthenium activity was measured as a current density and then recalculated into a dissolution or corrosion rate (in Å/min) using Faraday's law. When hydrogen peroxide is used as the oxidizer, the calculated rates of dissolution and corrosion include an additional current density resulting from the electrochemical activity of hydrogen peroxide at the electrode. Thus, the reported dissolution and corrosion rates for ruthenium in the presence of hydrogen peroxide may be greater than the true ruthenium dissolution and corrosion rates.

Each of the polishing compositions contained 6 wt. % α-alumina and either 1 wt. % ammonium persulfate (Polishing Compositions 2A–2G) or 1 wt. % hydrogen peroxide and 0.1 N $K_2SO_4$ supporting electrolyte (Polishing Compositions 2A'–2G'). Polishing Compositions 2A and 2A' (control) contained no polishing additive. Polishing Compositions 2B–2E and 2B'–2E' (comparative) each contained 1 wt. % of glycine, mercaptosuccinic acid, potassium oxalate, and 1-hydroxyethylidene-1,1-diphosphonic acid (i.e., Dequest® 2010 product), respectively. Polishing Compositions 2F–2G and 2F'–2G' (invention) each contained 1 wt. % of picolinic acid and 2,5-cyclopentanedione, respectively. The dissolution and corrosion rates for ruthenium were measured for each of the chemical-mechanical polishing systems. The rates of dissolution and corrosion for ruthenium in the presence of ammonium persulfate oxidizing agent and hydrogen peroxide are summarized in Tables 3 and 4, respectively.

TABLE 3

Ruthenium Dissolution and Corrosion Rates with Ammonium Persulfate

| Polishing Composition | Polishing Additive | Oxidizer | pH | Ru Diss. Rate | Ru Corr. Rate |
|---|---|---|---|---|---|
| 2A (control) | none | $(NH_4)_2S_2O_8$ | 5.0 | 100 | 2.75 |
| | | | 8.2 | 63 | 2.5 |
| 2B (comparative) | glycine | $(NH_4)_2S_2O_8$ | 5.1 | 145 | 1.1 |
| | | | 8.2 | 250 | 4.5 |
| 2C (comparative) | mercaptosuccinic acid | $(NH_4)_2S_2O_8$ | 5 | 40 | 2.38 |
| | | | 8.4 | 80 | 0.45 |
| 2D (comparative) | potassium oxalate | $(NH_4)_2S_2O_8$ | 5.4 | 95 | 5 |
| | | | 8.2 | 145 | 1.75 |
| 2E (comparative) | 1-hydroxyethylidene-1,1-diphosphonic acid (Dequest ® 2010) | $(NH_4)_2S_2O_8$ | 5.0 | 85–125 | 0.3 |
| | | | 8.3 | 250 | 0.83 |
| 2F (invention) | picolinic acid | $(NH_4)_2S_2O_8$ | 4.9 | 110 | 0.75 |
| | | | 8.2 | 250 | 1.2 |
| 2G (invention) | 2,5-cyclopentanedione | $(NH_4)_2S_2O_8$ | 5.2 | 195 | 2.5 |
| | | | 8.1 | 250 | 2.5 |

TABLE 4

Ruthenium Dissolution and Corrosion Rates with Hydrogen Peroxide

| Polishing Composition | Polishing Additive | Oxidizer | pH | Ru Diss. Rate | Ru Corr. Rate |
|---|---|---|---|---|---|
| 2A' (control) | none | $H_2O_2$ | 5.0 | 75 | 9.5 |
| | | | 8.0 | 145 | 10 |
| 2B' (comparative) | glycine | $H_2O_2$ | 6.1 | 250 | 0.5 |
| | | | 8.6 | 1250 | 200 |
| 2C' (comparative) | mercaptosuccinic acid | $H_2O_2$ | 5.0 | 3000 | 127 |
| | | | 8.5 | 825 | 237 |
| 2D' (comparative) | potassium oxalate | $H_2O_2$ | 5.3 | 250 | 250 |
| | | | 8.1 | 300–1250 | 24 |
| 2E' (comparative) | 1-hydroxyethylidene-1,1-diphosphonic acid (Dequest ® 2010) | $H_2O_2$ | 5.4 | 800 | 212 |
| | | | 8.5 | 2500 | 250 |
| 2F' (invention) | picolinic acid | $H_2O_2$ | 5.0 | 2500 | 400 |
| | | | 8.6 | 2250 | 25 |
| 2G' (invention) | 2,5-cyclopentanedione | $H_2O_2$ | 5.2 | 1000 | 3.25 |
| | | | 8.1 | 950–2000 | 25 |

These results demonstrate that high noble metal dissolution rates can be obtained using a chemical-mechanical polishing composition of the invention.

EXAMPLE 3

This example demonstrates the effect of different polishing additives on the rate of dissolution of platinum and ruthenium.

The dissolution and corrosion rates of platinum and ruthenium were evaluated electrochemically using either a platinum or ruthenium rotating disk electrode in the presence of different polishing compositions (Polishing Compositions 3A–3AA). The platinum and ruthenium metal electrodes were rotating at 500 rpm and held in contact with an abrasive pad with a down force of about 90 kPa (13 psi). The platinum and ruthenium dissolution rates were evaluated as the surface of the electrode was abraded (dissolution rate) and after abrasion (corrosion rate). The platinum and ruthenium activity was measured as a current density and then recalculated into a dissolution or corrosion rate (in Å/min) using Faraday's law. When hydrogen peroxide is used as the oxidizer, the calculated rates of dissolution and corrosion include an additional current density resulting from the electrochemical activity of hydrogen peroxide at the electrode. Thus, the reported dissolution and corrosion rates for platinum or ruthenium in the presence of hydrogen peroxide may be greater than the true platinum or ruthenium dissolution and corrosion rates.

The dissolution and corrosion rates for the polishing compositions were evaluated in two groups. The first data set consisted of Polishing Compositions 3A–3Q. The second data set consisted of Polishing Compositions 3R–3AA.

Each of the Polishing Compositions 3A–3Q contained 6 wt. % α-alumina, 1 wt. % hydrogen peroxide, and 0.1 N $K_2SO_4$ supporting electrolyte. Polishing Composition 3A (control) comprised no polishing additive. Polishing Compositions 3B–3G (comparative) each contained 1 wt. % cyclobutane dicarboxylic acid, lactic acid, 1-hydroxyethylidene-1,1-diphosphonic acid (i.e., Dequest® 2010 product), glycine, sucrose, and ethanol, respectively. Polishing Compositions 3H–3Q (invention) each contained 1 wt. % 3-(3-pyridyl)propionic acid, 2-pyridinemethanol, 2-pyridine carboxaldehyde, 2-pyridinecarboxamide, 2,3-pyridine dicarboxylic acid, 2-pyridylacetic acid HCl, 4-pyridineethane sulfonic acid, 2,5-cyclopentanedione, $FeSO_4$, and $Fe(NO_3)_3$, respectively.

Each of the polishing compositions 3R–3AA contained 6 wt. % α-alumina, 1 wt. % hydrogen peroxide, and 0.1 N $K_2SO_4$ supporting electrolyte except for Polishing Compositions 3S and 3W which did not contain any hydrogen peroxide. Polishing Compositions 3R–3AA (invention) each contained 1 wt. % sulfanilic acid, 2-pyridineethanesulfonic acid (no HPO), 2-pyridineethanesulfonic acid, 2-pyridinesulfonic acid, 3-pyridylacetic acid HCl, 4-pyridylacetic acid HCl (no HPO), 4-pyridylacetic acid HCl, 2-pyrazine carboxylic acid, 1-(3-sulfopropyl)pyridinium hydroxide, and 4-pyridineethanesulfonic acid, respectively.

The dissolution and corrosion rates for platinum and ruthenium were measured for each of the chemical-mechanical polishing systems. The dissolution and corrosion rates for platinum and ruthenium for each of the chemical-mechanical polishing systems are summarized in Tables 5 and 6.

TABLE 5

Platinum and Ruthenium Dissolution and Corrosion Rates

| Polishing Composition | Polishing Additive | pH | Pt Diss. Rate | Pt Corr. Rate | Ru Diss. Rate | Ru Corr. Rate |
|---|---|---|---|---|---|---|
| 3A (control) | none | 5 | 29 | 2.9 | 55 | 10 |
|  |  | 9.5 | 150 | 35 | 130 | 30 |
| 3B (comparative) | cyclobutane dicarboxylic acid | 5 | 10150 | 3480 | 1550 | 375 |
|  |  | 9.5 | 64 | 377 | 3000 | 25 |
| 3C (comparative) | lactic acid | 5 | 1160 | 290 | 700 | 400 |
|  |  | 9.5 | 29 | 9 | 1450 | 6.25 |
| 3D (comparative) | 1-hydroxyethylidene-1,1-diphosphonic acid (Dequest® 2010) | 5 | 377 | 116 | 1000 | 140 |
|  |  | 9.5 | 348 | 174 | 2500 | 105 |
| 3E (comparative) | glycine | 5 | 46 | 116 | 50 | 5 |
|  |  | 9.5 | 93 | 129 | 125 | 125 |
| 3F (comparative) | sucrose | 5 | 29 | 2.9 | 33 | 7.5 |
|  |  | 9.5 | 116 | 61 | 138 | 40 |
| 3G (comparative) | ethanol | 5 | 93 | 26 | 125 | 35 |
|  |  | 9.5 | 23 | 20 | 145 | 40 |
| 3H (invention) | 3-(3-pyridyl)propionic acid | 5 | 2175 | 841 | 1250 | 178 |
|  |  | 9.5 | 377 | 46 | 700 | 73 |
| 3I (invention) | 2-pyridine methanol | 5 | 2900 | 2030 | 1735 | 250 |
|  |  | 9.5 | 116 | 580 | 750 | 200 |
| 3J (invention) | 2-pyridine carboxaldehyde | 5 | 1421 | 667 | 800 | 120 |
|  |  | 9.5 | 81 | 24 | 200 | 8 |
| 3K (invention) | 2-pyridine carboxamide | 5 | 32 | 14 | 25 | 5 |
|  |  | 9.5 | 87 | 35 | 123 | 33 |
| 3L (invention) | 2,3-pyridine dicarboxylic acid | 5 | 3770 | 1769 | 1500 | 325 |
|  |  | 9.5 | 174 | 67 | 2025 | 113 |
| 3M (invention) | 2-pyridylacetic acid HCl | 5 | 1740 | 580 | 1500 | 200 |
|  |  | 9.5 | 101 | 90 | 2750 | 55 |
| 3N (invention) | 4-pyridineethane sulfonic acid | 5 | 2900 | 667 | 1675 | 250 |
|  |  | 9.5 | 116 | 87 | 1625 | 175 |
| 3O (invention) | 2,5-cyclopentanedione | 5 | 46 | 4 | 105 | 15 |
|  |  | 9.5 | 197 | 102 | 1800 | 800 |
| 3P (invention) | $FeSO_4$ | 5 | 232 | 63 | 88 | 50 |
|  |  | 9.5 | 87 | 35 | 130 | 33 |
| 3Q (invention) | $Fe(NO_3)_3$ | 5 | 52 | 20 | 150 | 15 |
|  |  | 9.5 | 116 | 58 | 145 | 100 |

TABLE 6

Platinum and Ruthenium Dissolution and Corrosion Rates

| Polishing Composition | Polishing Additive | pH | Pt Diss. Rate | Pt Corr. Rate | Ru Diss. Rate | Ru Corr. Rate |
|---|---|---|---|---|---|---|
| 3R (invention) | sulfanilic acid | 5 | 37 | 22 | 450 | 95 |
|  |  | 9.5 | 348 | 116 | 450 | 50 |
| 3S (invention) | 2-pyridineethanesulfonic acid (no HPO) | 5 | 12 | 4 | 25 | 1 |
|  |  | 9.5 | 29 | 5 | 7.5 | 2 |
| 3T (invention) | 2-pyridineethanesulfonic acid | 5 | 1740 | 1247 | 300 | 150 |
|  |  | 9.5 | 551 | 203 | 250 | 145 |
| 3U (invention) | 2-pyridine sulfonic acid | 5 | 58 | 35 | 250 | 33 |
|  |  | 9.5 | 667 | 174 | 550 | 40 |
| 3V (invention) | 3-pyridylacetic acid HCl | 5 | 899 | 580 | 950 | 88 |
|  |  | 9.5 | 319 | 290 | 1025 | 100 |
| 3W (invention) | 4-pyridylacetic acid HCl (no HPO) | 5 | 13 | 4 | 30 | 4.5 |
|  |  | 9.5 | 19 | 6 | 23 | 0.8 |
| 3X (invention) | 4-pyridylacetic acid HCl | 5 | 928 | 158 | 750 | 158 |
|  |  | 9.5 | 1450 | 116 | 525 | 175 |
| 3Y (invention) | 2-pyrazine carboxylic acid | 5 | 29 | 8 | 150 | 8 |
|  |  | 9.5 | 348 | 87 | 500 | 90 |
| 3Z (invention) | 1-(3-sulfopropyl) pyridinium hydroxide | 5 | 29 | 13 | 300 | 2.5 |
|  |  | 9.5 | 377 | 87 | 375 | 75 |
| 3AA (invention) | 4-pyridineethane sulfonic acid | 5 | 957 | 377 | 925 | 170 |
|  |  | 9.5 | 928 | 116 | 400 | 78 |

These results demonstrate that high noble metal dissolution rates can be obtained using a chemical-mechanical polishing composition of the invention.

EXAMPLE 4

This example demonstrates the effect of polishing additives on the rate of dissolution of platinum.

The dissolution and corrosion rates of platinum were evaluated electrochemically using a platinum rotating disk electrode in the presence of two different polishing compositions (Polishing Compositions 4A and 4B). The platinum electrode was rotating at 500 rpm and held in contact with an abrasive pad with a down force of about 90 kPa (13 psi). The platinum dissolution rate was evaluated as the surface of the electrode was abraded (dissolution rate) and after abrasion (corrosion rate). The platinum activity was measured as a current density and then recalculated into a dissolution or corrosion rate (in Å/min) using Faraday's law.

Each of the polishing compositions contained 6 wt. % α-alumina, 1 wt. % ammonium persulfate, and 1 wt. % polishing additive. Polishing Composition 4A (comparative) contained 1 wt. % triethylamine as the polishing additive. Polishing Composition 4B (invention) contained 1 wt. % 1,10-phenanthroline as the polishing additive. The dissolution and corrosion rates for platinum were measured for each of the chemical-mechanical polishing systems at pH values ranging from 5 to 10. The dissolution and corrosion rates for platinum for each of the chemical-mechanical polishing systems are summarized in Table 7.

TABLE 7

Platinum Dissolution and Corrosion Rates

| Polishing Composition | Oxidizer | Polishing Additive | pH | Pt Diss. Rate | Pt Corr. Rate |
|---|---|---|---|---|---|
| 4A (comparative) | $(NH_4)_2S_2O_8$ | $NEt_3$ | 8.5 | 146 | 4.5 |
| 4B (invention) | $(NH_4)_2S_2O_8$ | 1,10-phenanthroline | 5.8 | 33.6 | 0.01 |
|  |  |  | 7.2 | 53.2 | 0.5 |
|  |  |  | 8.0 | 168 | 1.4 |
|  |  |  | 8.7 | 128 | 1.54 |
|  |  |  | 9.5 | 203 | 1.78 |

These results demonstrate that high noble metal dissolution rates can be obtained using a chemical-mechanical polishing composition of the invention.

EXAMPLE 5

This example compares the effect of polishing compositions comprising heterocyclic nitrogen-containing compounds on the rate of platinum or ruthenium removal.

Similar substrates comprising platinum or ruthenium layers were polished on a tabletop polisher with different polishing compositions (Polishing Compositions 5A–5G). Each of the Polishing Compositions 5A (comparative) and 5B–5G (inventive) contained 8 wt. % alumina (60% α-alumina/40% fumed alumina), 1 wt. % hydrogen peroxide, and 1 wt. % of either cyclobutane dicarboxylic acid, 2-pyridinecarboxaldehyde, 2-pyridinemethanol, 2,3-pyridine dicarboxylic acid, 2,6-pyridine dicarboxylic acid, 2-pyridylacetic acid HCl, or 2-pyridineethanesulfonic acid, respectively. The removal rates for platinum or ruthenium were measured for each of the chemical-mechanical polishing systems at two different pH values (within ranges of 4.9–5.5 and 9–9.8). The removal rates for platinum and ruthenium for the chemical-mechanical polishing systems are summarized in Table 8.

TABLE 8

Platinum and Ruthenium Removal Rates for Various Polishing Additives

| Polishing Composition | Polishing Additive | pH | Pt RR (Å/min) | Ru RR (Å/min) |
|---|---|---|---|---|
| 5A (comparative) | cyclobutane dicarboxylic acid | 4.9 | 454 | 424 |
|  |  | 9.4 | 632 | 576 |
| 5B (invention) | 2-pyridine carboxaldehyde | 5.1 | 749 | 293 |
|  |  | 9.5 | 601 | 378 |
| 5C (invention) | 2-pyridinemethanol | 5.5 | 546 | 247 |
|  |  | 9.5 | 489 | 496 |
| 5D (invention) | 2,3-pyridinedicarboxylic acid | 5 | 566 | 335 |
|  |  | 9.5 | 530 | 414 |
| 5E (invention) | 2,6-pyridinedicarboxylic acid | 5 | 663 | 413 |
|  |  | 9.2 | 324 | 594 |
| 5F (invention) | 2-pyridylacetic acid HCl | 5.1 | 1043 | 216 |
|  |  | 9.8 | 511 | 531 |
| 5G (invention) | 2-pyridineethanesulfonic acid | 5.0 | 1077 | 200 |
|  |  | 9.7 | 463 | 270 |

These results demonstrate that high noble metal removal rates can be obtained using a chemical-mechanical polishing composition comprising a heterocyclic nitrogen-containing compound as a polishing additive.

EXAMPLE 6

This example compares the effect of polishing compositions comprising heterocyclic nitrogen-containing compounds with a polishing composition comprising no polishing additive on the rate of platinum or ruthenium removal.

Similar substrates comprising platinum or ruthenium, silica, and titanium layers were polished on a tabletop polisher with different polishing compositions (Polishing Compositions 6A–6F). Each of the polishing compositions contained 4 wt. % alumina (60% α-alumina, 40% fumed alumina) and 1 wt. % hydrogen peroxide. Polishing Compositions 6A and 6F (control) contained no polishing additive, and no oxidant. Polishing Compositions 6B and 6G (control) contained no polishing additive, and 1 wt. % hydrogen peroxide. Polishing Compositions 6C, 6D, and 6E (invention) each contained 1 wt. % of either 2-pyridylacetic acid HCl (without and with oxidant) or picolinic acid, respectively. Polishing Compositions 6H, 6I, and 6J (invention) each contained 6 wt. % alumina (60% α-alumina, 40% fumed alumina) and 1 wt. % of either 4-pyridineethanesulfonic acid (without and with oxidant) or 2-pyridylacetic acid HCl, respectively. The removal rates for ruthenium were measured for each of the chemical-mechanical polishing systems at a pH of 9.5. The removal rates for platinum were measured for each of the chemical-mechanical polishing systems at a pH of 2. The removal rates for ruthenium and platinum for the chemical-mechanical polishing systems are summarized in Tables 9 and 10.

TABLE 9

Ruthenium Removal Rates for Various Polishing Additives

| Polishing Composition | Polishing Additive | Abrasive | Oxidant | pH | Ru RR (Å/min) | SiO$_2$ RR (Å/min) | Ti RR (Å/min) |
|---|---|---|---|---|---|---|---|
| 6A (control) | none | 4 wt. % alumina | None | 9.5 | 87 | 1423 | 1327 |
| 6B (control) | none | 4 wt. % alumina | 1 wt. % H$_2$O$_2$ | 9.5 | 960 | 1172 | 1988 |
| 6C (invention) | 1 wt. % 2-pyridylacetic acid HCl | 4 wt. % alumina | None | 9.5 | 38 | 1054 | 1309 |
| 6D (invention) | 1 wt. % 2-pyridylacetic acid HCl | 4 wt. % alumina | 1 wt. % H$_2$O$_2$ | 9.5 | 1119 | 809 | 1896 |
| 6E (invention) | 1 wt. % picolinic acid | 4 wt. % alumina | 1 wt. % H$_2$O$_2$ | 9.5 | 1028 | 567 | 1263 |

TABLE 10

Platinum Removal Rates for Various Polishing Additives

| Polishing Composition | Polishing Additive | Abrasive | Oxidant | pH | Pt RR (Å/min) | SiO$_2$ RR (Å/min) | Ti RR (Å/min) |
|---|---|---|---|---|---|---|---|
| 6F (control) | none | 6 wt. % alumina | None | 2 | 2098 | 89 | 442 |
| 6G (control) | none | 6 wt. % alumina | 1 wt. % H$_2$O$_2$ | 2 | 1961 | 94 | 2163 |
| 6H (invention) | 1 wt. % 4-pyridineethane sulfonic acid | 6 wt. % alumina | None | 2 | >5000 | 79 | 597 |
| 6I (invention) | 1 wt. % 4-pyridineethane sulfonic acid | 6 wt. % alumina | 1 wt. % H$_2$O$_2$ | 2 | >5000 | 92 | 1392 |

TABLE 10-continued

Platinum Removal Rates for Various Polishing Additives

| Polishing Composition | Polishing Additive | Abrasive | Oxidant | pH | Pt RR (Å/min) | SiO$_2$ RR (Å/min) | Ti RR (Å/min) |
|---|---|---|---|---|---|---|---|
| 6J (invention) | 1 wt. % 2-pyridylacetic acid HCl | 6 wt. % alumina | 1 wt. % H$_2$O$_2$ | 2 | 3000 | 104 | 966 |

These results demonstrate that high noble metal removal rates can be obtained using a chemical-mechanical polishing composition comprising a heterocyclic nitrogen-containing compound as a polishing additive.

EXAMPLE 7

This example compares the effect of polishing compositions comprising metal compounds and salts with a polishing composition comprising no polishing additive on the rate of platinum and ruthenium removal.

Similar substrates comprising platinum or ruthenium layers were polished on a tabletop polisher with different polishing compositions (Polishing Compositions 7A–7F). Each of the polishing compositions contained 5 wt. % alumina (60% α-alumina, 40% fumed alumina) and 1 wt. % hydrogen peroxide. Polishing Composition 7A (control) contained no iron salts or polishing additive. Polishing Compositions 7B, 7C, 7D, 7E, and 7F (invention) each contained 0.01 wt. % of Fe(III) nitrate, 0.01 wt. % Fe(II) sulfate, 100 ppm Mn(II) perchlorate, 100 ppm Cu(II) nitrate, and 100 ppm Ce(IV) oxide, respectively. The removal rates for platinum or ruthenium were measured for each of the chemical-mechanical polishing systems at pH 2, 5, and/or 9.5. The removal rates for platinum and ruthenium for the chemical-mechanical polishing systems are summarized in Table 11.

TABLE 11

Platinum and Ruthenium Removal Rates for Various Iron Compounds

| Polishing Composition | Polishing Additive | Oxidizer | pH | Pt RR (Å/min) | Ru RR (Å/min) |
|---|---|---|---|---|---|
| 7A (control) | none | H$_2$O$_2$ | 5 | 1186 | 150 |
|  |  |  | 9.5 | 1036 | 262 |
| 7B (invention) | Fe(III) nitrate | H$_2$O$_2$ | 5 | 1614 | 258 |
|  |  |  | 9.5 | 677 | 331 |
| 7C (invention) | Fe(II) sulfate | H$_2$O$_2$ | 5 | 1451 | 221 |
|  |  |  | 9.5 | 656 | 546 |
| 7D (invention) | Mn(II) perchlorate | H$_2$O$_2$ | 2 | 938 | — |
|  |  |  | 5 | 598 | 353 |
|  |  |  | 9.5 | 1101 | 544 |
| 7E (invention) | Cu(II) nitrate | H$_2$O$_2$ | 2 | 881 | — |
|  |  |  | 5 | 266 | 469 |
|  |  |  | 9.5 | 898 | 508 |
| 7F (invention) | Ce(IV) oxide | H$_2$O$_2$ | 5 | — | 428 |

These results demonstrate that high noble metal removal rates can be obtained using a chemical-mechanical polishing composition comprising a metal compound or salt in conjunction with a peroxy-type oxidizer.

EXAMPLE 8

This example compares the effect of polishing compositions comprising nitrogen-containing compounds that can be zwitterionic compounds on the rate of platinum or ruthenium removal.

Similar substrates comprising platinum, ruthenium, or oxide layers were polished on a tabletop polisher with different polishing compositions (Polishing Compositions 8A–8C). Each of the Polishing Compositions 8A–8C (invention) contained 8 wt. % alumina (60% α-alumina, 40% fumed alumina), 1 wt. % hydrogen peroxide, and 1 wt. % of either 3-pyridinesulfonic acid, 1-(3-sulfopropyl)pyridinium hydroxide, or sulfanilic acid, respectively. The removal rates for platinum, ruthenium, and oxide for each of the chemical-mechanical polishing systems were determined, and the results are summarized in Table 12.

TABLE 12

Platinum and Ruthenium Removal Rates for Various Polishing Additives

| Polishing Composition | Polishing Additive | pH | Pt RR (Å/min) | Ru RR (Å/min) | Oxide RR (Å/min) |
|---|---|---|---|---|---|
| 8A (invention) | 3-pyridine-sulfonic acid | 5.1 | 584 | 485 | 274 |
| 8B (invention) | 1-(-sulfo-propyl) pyridinium hydroxide | 5 | 950 | 282 | 187 |
| 8C (invention) | sulfanilic acid | 5 | 636 | 395 | 160 |

These results demonstrate that high noble metal removal rates can be obtained using a chemical-mechanical polishing composition comprising a nitrogen-containing compound that can be a zwitterionic compound as a polishing additive.

EXAMPLE 9

This example compares the effect of polishing compositions comprising different ratios of α-alumina to fumed alumina on the rate of platinum or ruthenium removal.

Similar substrates comprising platinum, titanium, or oxide layers were polished on a tabletop polisher with different polishing compositions (Polishing Compositions 9A–9F). Each of the Polishing Compositions 9A and 9F (comparative) and 9B–9E (invention) contained 8 wt. % alumina with 20%, 40%, 50%, 60%, 80%, and 100% α-alumina and 80%, 60%, 50%, 40%, 20% and 0% fumed alumina, respectively. The removal rates for platinum, titanium, and silicon dioxide for each of the chemical-mechanical polishing systems were determined, and the results are summarized in Table 13.

TABLE 13

Platinum, Titanium, and Oxide Removal Rates for Various Abrasive Mixtures

| Polishing Composition | % α-alumina | % fumed alumina | Pt RR (Å/min) | Ti RR (Å/min) | Oxide RR (Å/min) |
|---|---|---|---|---|---|
| 9A (comparative) | 20 | 80 | 884 | — | — |
| 9B (invention) | 40 | 60 | 1262 | 1155 | 55 |
| 9C (invention) | 50 | 50 | 1550 | — | — |
| 9D (invention) | 60 | 40 | 1649 | 1097 | 50 |
| 9E (invention) | 80 | 20 | 1640 | 1174 | 58 |
| 9F (comparative) | 100 | 0 | 354 | — | — |

These results demonstrate that high noble metal removal rates can be obtained using a chemical-mechanical polishing composition comprising about 40% to about 90% α-alumina and about 60% to about 10% fumed alumina, reflecting a weight ratio of α-alumina to fumed alumina of about 0.6:1 to about 4:1.

EXAMPLE 10

This example compares the effect of polishing compositions comprising sulfonic acid compounds on the rate of platinum removal.

Similar substrates comprising platinum were polished on an IPEC 472 polisher with different polishing compositions (Polishing Compositions 10A–10L). Each of the polishing compositions contained 3 wt. % alumina (60% α-alumina, 40% fumed alumina) and had a pH of 3. Polishing Composition 10A (control) contained no polishing additive. Polishing Compositions 10B–10I (invention) contained about 4.4 mM hydroquinonesulfonic acid, 1-(3-sulfopropyl)pyridinium hydroxide, benzenesulfonic acid, 4-pyridineethanesulfonic acid, sulfanilic acid, N-tris(hydroxymethyl)methyl-2-aminoethanesulfonic acid, isethionic acid, and potassium trifluoromethanesulfonate, respectively. Polishing Compositions 10J–10L (comparative) contained potassium sulfate, 2,5-dihydroxybenzoic acid, and hydroquinone, respectively.

The removal rates (RR) and within-wafer-non-uniformity (WIWNU) of platinum were determined for each of the chemical-mechanical polishing systems, and the results are summarized in Table 14.

TABLE 14

Platinum Removal Rates for Sulfonic Acid Compounds

| Polishing Composition | Polishing Additive | RR (Å/min) | WIWNU (%) |
|---|---|---|---|
| 10A (control) | none | 631 | 34.8 |
| 10B (invention) | hydroquinone sulfonic acid | 2879 | 23.4 |
| 10C (invention) | 1-(3-sulfopropyl)pyridinium hydroxide | 3634 | 10.8 |
| 10D (invention) | benzenesulfonic acid | 3600 | 12.2 |
| 10E (invention) | 4-pyridineethanesulfonic acid | 2968 | 26.3 |
| 10F (invention) | sulfanilic acid | 2342 | 25.3 |
| 10G (invention) | N-tris(hydroxymethyl)methyl-2-aminoethane sulfonic acid | 950 | 22.3 |
| 10H (invention) | isethionic acid | 896 | 26.6 |
| 10I (invention) | potassium trifluoromethanesulfonate | 539 | 42.2 |
| 10J (comparative) | potassium sulfate | 498 | 15.9 |
| 10K (comparative) | 2,5-dihydroxybenzoic acid | 118 | 64.5 |
| 10L (comparative) | hydroquinone | 605 | 23.7 |

These results demonstrate that high noble metal removal rates can be obtained using a chemical-mechanical polishing composition comprising a sulfonic acid compound.

EXAMPLE 11

This example compares the effect of polishing compositions comprising sulfonic acid compounds with different abrasives on the rate of platinum removal.

Similar substrates comprising platinum were polished on an IPEC 472 polisher with different polishing compositions (Polishing Compositions 11A–11G). Polishing Compositions 11A and 11B each contained 1 wt. % hydroquinonesulfonic acid (HQSA) and had a pH of 3. Polishing Compositions 11A contained 8 wt. % fumed alumina. Polishing Composition 11B contained 8 wt. % fumed silica. Polishing Compositions 11C–11G each contained 3 wt. % alumina (60% α-alumina, 40% fumed alumina) and had a pH of 3. Polishing Compositions 11C and 11D contained α-alumina having a mean particle size of 100 nm, and contained 0 and 1 wt. % hydroquinonesulfonic acid (HQSA), respectively. Polishing Compositions 11E–11G contained α-alumina having a mean particle size of 250 nm, and contained 0, 0.5, and 1 wt. % hydroquinonesulfonic acid (HQSA), respectively.

The removal rates (RR) and within-wafer-non-uniformity (WIWNU) of platinum were determined for each of the chemical-mechanical polishing systems, and the results are summarized in Table 15.

TABLE 15

Platinum Removal Rates

| Polishing Composition | Abrasive | Mean Particle Size α-Alumina | Polishing Additive | RR (Å/min) | WIWNU (%) |
|---|---|---|---|---|---|
| 11A (invention) | 8 wt. % fumed alumina | N/A | 1 wt. % HQSA | 0 | N/A |
| 11B (invention) | 8 wt. % fumed silica | N/A | 1 wt. % HQSA | 0 | N/A |
| 11C (control) | 1.8 wt. % α-alumina 1.2 wt. % fumed alumina | 100 nm | 0 wt. % HQSA | 269 | 18.5 |
| 11D (invention) | 1.8 wt. % α-alumina 1.2 wt. % fumed alumina | 100 nm | 1 wt. % HQSA | 9 | 36.3 |
| 11E (control) | 1.8 wt. % α-alumina 1.2 wt. % fumed alumina | 250 nm | 0 wt. % HQSA | 631 | 34.8 |
| 11F (invention) | 1.8 wt. % α-alumina 1.2 wt. % fumed alumina | 250 nm | 0.5 wt. % HQSA | 1808 | 22.5 |
| 11G (invention) | 1.8 wt. % α-alumina 1.2 wt. % fumed alumina | 250 nm | 1 wt. % HQSA | 2984 | 21.6 |

These results demonstrate that high noble metal removal rates can be obtained using a chemical-mechanical polishing composition comprising α-alumina in combination with a sulfonic acid compound.

EXAMPLE 12

This example compares the effect of polishing compositions comprising sulfonic acid compounds with polishing compositions comprising phosphonic acid compounds on the rate of platinum removal.

Similar substrates comprising platinum were polished on an IPEC 472 polisher with different polishing compositions (Polishing Compositions 12A–12E). Polishing Compositions 12A–12E each contained 3 wt. % alumina (60% α-alumina, 40% fumed alumina) and had a pH of 3. Polishing Compositions 12A (control) did not contain any polishing additives. Polishing Compositions 12B and 12C (invention) contained 1 wt. % 5-formyl-2-furane sulfonic acid and 1-(3-sulfopropyl)pyridinium hydroxide respectively. Polishing Compositions 12D and 12E contained phenylphosphonic acid and 2-carboxyethylphosphonic acid, respectively.

The removal rates (RR) and within-wafer-non-uniformity (WIWNU) of platinum were determined for each of the chemical-mechanical polishing systems, and the results are summarized in Table 16.

TABLE 16

Platinum Removal Rates

| Polishing Composition | Polishing Additive | RR (Å/min) | WIWNU (%) |
|---|---|---|---|
| 12A (control) | none | 1101.4 | 14.8 |
| 12B (invention) | 5-formyl-2-furane sulfonic acid | 2141.7 | 26.0 |
| 12C (control) | 1-(3-sulfopropyl)pyridinium hydroxide | 2638.1 | 13.8 |
| 12D (comparative) | phenylphosphonic acid | 102.0 | 21.9 |
| 12E (comparative) | 2-carboxyethyl-phosphonic acid | 139.8 | 37.2 |

These results demonstrate that high noble metal removal rates can be obtained using a chemical-mechanical polishing composition comprising sulfonic acid compounds.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate comprising a noble metal selected from the group consisting of platinum, iridium, rhenium, ruthenium, rhodium, palladium, silver, osmium, and gold, with a chemical-mechanical polishing system comprising:
      (a) an abrasive, a polishing pad, or a combination thereof
      (b) a liquid carrier, and
      (c) a sulfonic acid compound selected from the group consisting of pyridineethanesulfonic acids, pyridine sulfonic acids, 1-(3-sulfopropyl)pyridinium hydroxide, sulfanilic acid, dodecyldimethyl(3-sulfopropyl) ammonium hydroxide, 2-(N-morpholino)ethanesulfonic acid, N-2-acetamido-2-aminoethanesulfonic acid, 3-(N-morpholine)propanesulfonic acid, N-tris(hydroxymethyl)methyl-2-aminoethanesulfonic acid, N-2-hydroxyethylpiperazine-N'-2-ethanesulfonic acid, N-2-hydroxyethylpiperazine-N'-3-propanesulfonic acid, cyclohexylaminoethanesulfonic acid, 3-(cyclohexylamino)propanesulfonic acid, 2-acrylamido-2-methylpropanesulfonic acid, benzenesulfonic acid, hydroquinonesulfonic acid, hydroquinolinesulfonic acid, isethionic acid, 4,7-diphenyl-1,10-phenanthrolinedisulfonic acid, 1,2-naphthoquinone-4-sulfonic acid, aminoanthraquinone sulfonic acid, 2-formylbenzenesulfonic acid, 3-amino-4-hydroxybenzenesulfonic acid, 4-hydroxybenzenesulfonic acid, 6-aminotoluene-3-sulfonic acid, benzidine-3-sulfonic acid, diphenylamine-4-sulfonic acid, hydroxylamine-O-sulfonic acid, piperidine sulfonic acid, p-anisidine-3-sulfonic acid, p-xylene-2-sulfonic acid, methanesulfonic acid, 3-cyclohexylamino-1-propanesulfonic acid, 5-formyl-2-furanesulfonic acid, salts thereof, and combinations thereof,
   wherein the chemical-mechanical polishing system has a pH of about 2 to about 12, and
   (ii) abrading at least a portion of the substrate to polish the substrate.

2. The method of claim 1, wherein the sulfonic acid compound is selected from the group consisting of 2-pyridineethanesulfonic acid, 4-pyridineethanesulfonic acid, 1-(3-sulfopropyl)pyridinium hydroxide, sulfanilic acid, pyridinesulfonic acid, dodecyldimethyl(3-sulfopropyl)ammonium hydroxide, 2-(N-morpholino)ethanesulfonic acid, N-2-acetamido-2-aminoethanesulfonic acid, 3-(N-morpholine)propanesulfonic acid, N-tris(hydroxymethyl)methyl-2-aminoethanesulfonic acid, N-2-hydroxyethylpiperazine-N'-2-ethanesulfonic acid, N-2-hydroxyethylpiperazine-N'-3-propanesulfonic acid, cyclohexylaminoethanesulfonic acid, 3-(cyclohexylamino)propanesulfonic acid, 2-acrylamido-2-methylpropanesulfonic acid, salts thereof, and combinations thereof.

3. The method of claim 1, wherein the sulfonic acid compound is selected from the group consisting of hydroquinonesulfonic acid, N-tris(hydroxymethyl)methyl-2-aminoethanesulfonic acid, benzenesulfonic acid, isethionic acid, 5-formyl-2-furanesulfonic acid, salts thereof, and combinations thereof.

4. The method of claim 1, wherein the chemical-mechanical polishing system comprises an abrasive.

5. The method of claim 4, wherein the abrasive is a metal oxide selected from the group consisting of alumina, silica, titania, ceria, zirconia, germania, magnesia, co-formed products thereof, and combinations thereof.

6. The method of claim 5, wherein the abrasive comprises α-alumina.

7. The method of claim 6, wherein the α-alumina has a mean particle size of about 200 nm or greater.

8. The method of claim 6, wherein the abrasive further comprises fumed alumina.

9. The method of claim 4, wherein the system comprises about 0.05 wt. % or more abrasive that is suspended in the carrier and about 0.01 to about 10 wt. % sulfonic acid compound.

10. The method of claim 4, wherein the abrasive is fixed on a polishing pad.

11. The method of claim 4, wherein the abrasive is in particulate form and is suspended in the carrier.

12. The method of claim 1, wherein the liquid carrier comprises water.

13. The method of claim 1, wherein the substrate comprises platinum, iridium, or ruthenium.

14. The method of claim 13, wherein the substrate comprises platinum.

15. The method of claim 14, wherein the system has a pH of about 2 to about 7.

* * * * *